US008604102B2

(12) United States Patent
Shieh et al.

(10) Patent No.: US 8,604,102 B2
(45) Date of Patent: Dec. 10, 2013

(54) THERMOSETTING COMPOSITION

(75) Inventors: Tien-Shou Shieh, Taipei (TW); Pei-Ching Liu, Miaoli (TW)

(73) Assignee: Industrial Technology Research Institute, Hsinchu (TW)

( * ) Notice: Subject to any disclaimer, the term of this patent is extended or adjusted under 35 U.S.C. 154(b) by 137 days.

(21) Appl. No.: 13/113,418

(22) Filed: May 23, 2011

(65) Prior Publication Data

US 2012/0123039 A1 May 17, 2012

(30) Foreign Application Priority Data

Nov. 16, 2010 (TW) .............................. 99139298 A

(51) Int. Cl.
*C08G 59/22* (2006.01)
*C08G 59/50* (2006.01)
*C08K 3/22* (2006.01)
*C08K 3/34* (2006.01)
*C08L 63/00* (2006.01)
*C08L 63/02* (2006.01)
*C08L 63/04* (2006.01)

(52) U.S. Cl.
USPC ........... 523/427; 523/400; 523/428; 523/456; 523/457; 523/466; 524/430; 524/445; 524/451; 525/524; 525/526

(58) Field of Classification Search
USPC ............. 528/86–88, 103, 106, 109, 119–124; 523/400, 427; 524/451; 525/50, 55, 525/100, 185–187, 403, 407
See application file for complete search history.

(56) References Cited

U.S. PATENT DOCUMENTS

| 4,330,659 | A | * | 5/1982 | King et al. ...................... 528/99 |
| 4,567,216 | A | * | 1/1986 | Qureshi et al. ................. 523/400 |
| 4,996,284 | A | * | 2/1991 | Mallavarapu ................... 528/92 |
| 5,001,175 | A | * | 3/1991 | Skora ............................. 523/448 |
| 5,296,582 | A | * | 3/1994 | Fujita et al. ...................... 528/27 |
| 5,331,068 | A | * | 7/1994 | Blyakhman .................... 525/523 |
| 5,635,259 | A | * | 6/1997 | Tahara et al. .................. 428/1.53 |
| 6,555,187 | B1 | * | 4/2003 | Kitamura ...................... 428/1.53 |
| 2006/0058473 | A1 | * | 3/2006 | Kawada et al. ............... 525/524 |
| 2008/0064815 | A1 | * | 3/2008 | Issari et al. .................... 525/100 |

FOREIGN PATENT DOCUMENTS

| CN | 1415659 A | 5/2003 |
| CN | 101243117 A | 8/2008 |
| JP | 10-135255 | 5/1998 |
| JP | 2006-179318 | 7/2006 |
| JP | 2006-228708 | 8/2006 |
| JP | 2007-112956 | 5/2007 |
| WO | WO 00/06661 A1 | 2/2000 |
| WO | WO 2007/049385 | 5/2007 |

OTHER PUBLICATIONS

Official Action issued on Sep. 5, 2013, by the Chinese Patent Office in corresponding application No. 201010601898.X.
Taiwan Office Action for Taiwan Patent Application No. 099139298 dated May 22, 2013.

* cited by examiner

*Primary Examiner* — David Buttner
*Assistant Examiner* — Ha Nguyen
(74) *Attorney, Agent, or Firm* — Muncy, Geissler, Olds & Lowe, PLLC

(57) ABSTRACT

The disclosure provides a thermosetting composition, including: (a) about 1-35 wt % of an oligomer, wherein the oligomer is obtained by reacting a liquid epoxy resin with an aromatic primary amine having four active hydrogen atoms, and the liquid epoxy resin and the primary amine have an equivalent mole ratio of 1:0.15-1:2.50; (b) about 5-10 wt % of a long chain resin; (c) about 50-80 wt % of an epoxy resin having at least two functional groups; and (d) about 5-15 wt % of a plasticizer.

10 Claims, No Drawings

THERMOSETTING COMPOSITION

CROSS REFERENCE TO RELATED APPLICATIONS

This application claims priority of Taiwan Patent Application No. 099139298, filed on Nov. 16, 2010, the entirety of which is incorporated by reference herein.

BACKGROUND

1. Field

The present disclosure relates to a thermosetting composition, and in particular relates to a thermosetting composition which is used as a sealing material for an organic electroluminescent device.

2. Description

Because organic electroluminescent devices have several advantages over its competitors, like being lighter, and thinner, and consuming less power with rapid response speeds and wide viewing angles, considerable research attention has been recently focused on development thereof.

A UV light curing epoxy resin is widely used in conventional organic electroluminescent devices. Because the epoxy resin is a brittle resin, it can not be used as a sealing material for a flexible substrate. Also, for surface-coated sealing requirements for a complete area, some problems may occur. For example, the organic materials of organic electroluminescent devices may degrade due to UV energy, the cathode and the organic layer of organic electroluminescent devices may peel due to rapid stress changes during curing processes of the epoxy resin, or the epoxy resin may not completely cure during the curing process.

In order to mitigate the above problems, a thermosetting resin has been disclosed. JP 10-135255 provides a thermosetting resin, wherein anhydride is used as a curing agent, and imidazole is used as a curing accelerating agent. However, the thermosetting resin is cured at a high temperature (about 170° C.). JP 2006-228708 provides a thermosetting resin, wherein anhydride is used as a curing agent, and 2,4,6-tri(dimethy phenol) is used as a curing accelerating agent. However, a curing reaction during the curing process must be conducted at a temperature of 100° C. for more than one hour.

Accordingly, there is a need to develop a thermosetting composition which may be used as a sealing material for organic electroluminescent devices, wherein the thermosetting composition does not adversely affect organic electroluminescent devices and may be used with flexible substrates.

BRIEF SUMMARY

The disclosure provides a thermosetting composition, including: (a) about 1-35 wt % of an oligomer, wherein the oligomer is obtained by reacting a liquid epoxy resin with an aromatic primary amine having four active hydrogen atoms, and the liquid epoxy resin and the primary amine has an equivalent mole ratio of 1:0.15-1:2.50; (b) about 5-10 wt % of a long chain resin; (c) about 50-80 wt % of an epoxy resin having at least two functional groups; and (d) about 5-15 wt % of a plasticizer.

A detailed description is given in the following embodiments with reference to the accompanying drawings.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

The disclosure provides a thermosetting composition which comprises the components (a)-(d), wherein the component (a) is about 1-35 wt % of an oligomer and the oligomer is obtained by reacting a liquid epoxy resin with an aromatic primary amine having four active hydrogen atoms, and the liquid epoxy resin and the primary amine have an equivalent mole ratio of 1:0.15-1:2.50.

Furthermore, the thermosetting composition further comprises other components, such as about 5-10 wt % of a long chain resin of the component (b), about 50-80 wt % of an epoxy resin of the component (c) having at least two functional groups, and about 5-15 wt % of a plasticizer of the component (d).

The liquid epoxy resin of the component (a) comprises bisphenol A epoxy resin, bisphenol F epoxy resin, aliphatic epoxy resin, cycloaliphatic epoxy resin or their derivatives. The aromatic primary amine having four active hydrogen atoms of the component (a) comprises 4,4'-diaminodiphenyl sulfone, 4-aminobenzenesulfonamide, 4,4'-diaminodiphenyl ether, 4,4'-(1,3-Phenylenedioxy)dianiline, 4,4'-diaminodiphenyl methane or their derivatives.

In one embodiment, bisphenol A epoxy resin and 4,4'-diaminodiphenyl sulfone are mixed at 100° C.-150° C. to obtain an oligomer. In another embodiment, bisphenol A epoxy resin and 4-aminobenzenesulfonamide are mixed at 100° C.-150° C. to obtain another oligomer.

The long chain resin of the component (b) has an average molar weight which is larger than 50,000 and comprises phenoxy resin, bisphenol A epoxy resin, bisphenol F epoxy resin, bisphenol A/F epoxy resin or their derivatives.

The epoxy resin of the component (c) comprises cresol novolac epoxy resin, phenol novolac epoxy resin, phenol A epoxy resin, phenol F epoxy resin, aliphatic epoxy resin, cycloaliphatic epoxy resin or their derivatives The plasticizer of the component (d) has a viscosity of about 20,000-52,000 cps at room temperature and comprises urethane acrylate oligomer, polyester acrylate oligomer, acrylic oligomer, phthalate esters or their derivatives.

Note that the component (a) is a rigid portion of the thermosetting resin and used as a curing agent of the thermosetting resin, the component (b) and (c) are used as a matrix of the thermosetting resin, and the plasticizer of the component (d) is used to improve the adhesion of the thermosetting resin.

Additionally, other additives may also be added into the thermosetting composition of the disclosure, such as a thermo-curing agent, a filler or a coupling agent. The thermo-curing agent comprises boron trifluoride monoethylamine, boron trifluoride p-toluidine, boron trifluoride N, N-dimethyl-p-toluidine, boron trifluoride benzyl amine or boron trifluoride N, N-dimethyl amine.

The function of the filler is to improve water and oxygen barrier performance of the thermosetting composition and the filler comprises silicon dioxide, talcum powder, aluminum oxide or clay.

The function of the coupling agent is to improve the adhesion of the thermosetting resin and the coupling agent comprises 3-glycidoxypropyltrimethoxysilane, 2-(3,4 epoxycyclohexyl)-ethyltrimethoxysilane, 3-glycidoxypropylmethyl diethoxy silane, or 3-glycidoxypropyltriethoxysilane.

The fabricating method of the thermosetting resin of the disclosure is described as follows. The oligomer is firstly synthesized by reacting the liquid epoxy resin with the aromatic primary amine having four active hydrogen atoms.

Then, the oligomer, the long chain resin, the epoxy resin having at least two functional groups and the plasticizer are mixed at 70° C.-90° C. for 15 min-30 min to conduct a curing reaction. Compared with the prior art (the reaction temperature is higher than 100° C. for more than one hour), the reaction time of the disclosure is shorter and reaction temperature of the disclosure is lower.

The flexibility of the thermosetting composition of the disclosure was determined by a Flexibility Test. Data shows that the thermosetting composition was bent over 3000 times without any obvious cracks. Thus, the thermosetting composition of the disclosure has good flexible ability. Further, the thermosetting composition of the disclosure was measured by a Peel Strength Test. The data of the Peel Strength Test shows that the peel strength of the thermosetting composition is about 2.5-3.5 kg. Thus, the thermosetting composition of the disclosure has good adhesion to the substrate, and the thermosetting composition may be applied to a flexible substrate package, and also to a metal or glass substrate package. Additionally, the thermosetting composition of the disclosure has the ability to inhibit the formation of dark spots, and exhibits good gas barrier properties.

Example (1) The Synthesis of the Oligomer 100 parts by weight of liquid bisphenol A resin (EPON 828) and 35 parts by weight of 4,4'-diaminodiphenyl sulfone (DDS) were put in an oil bath at 130° C. for 1 hour to obtain an oligomer (named as EO-01).

100 parts by weight of liquid bisphenol A resin (EPON 828) and 35 parts by weight of 4-aminobenzenesulfonamide were put in an oil bath at 130° C. for 1 hour to obtain an oligomer (named as EO-02).

100 parts by weight of liquid phenol A resin (EPON 828) and 5 parts by weight of 4,4'-diaminodiphenyl sulfone (DDS) were put in an oil bath at 130° C. for 1 hour to obtain an oligomer (named as EO-03).

100 parts by weight of liquid phenol A resin (EPON 828) and 80 parts by weight of 4,4'-diaminodiphenyl sulfone (DDS) were put in an oil bath at 130° C. for 1 hour to obtain an oligomer (named as EO-04).

(2) The Formation of the Thermosetting Composition (a) the oligomer is EO-01, EO-02, EO-03 or EO-04.

(b) the long chain resin is PKHH (phenoxy resin), EPIKOTE 1256 (bisphenol A type epoxy resin, Mw>51,000) or EPIKOTE 4250 (bisphenol A/F (50/50) type epoxy resin, Mw>59,000).

(c) the epoxy resin having at least two functional groups is ECN 1299 or EPON 828).

(d) the plasticizer is CN997 (urethane acrylate oligomer with a viscosity of 25,000 cps at 25° C.), CN2200 (polyester acrylate oligomer with a viscosity of 52,000 cps at 25° C.) or DOUBLEMER 3710 (acylicoligomer with a viscosity of 52,000 cps at 25° C.).

The components (a)-(d) and propylene glycol mono-methyl ether acetate (organic solvent) were mixed at 100° C., and talcum powder and thermo-curing agent (BF3-MEA (boron trifluoride monoethylamine)) were additionally added into the mixture, wherein the mixture was polished by a roller to obtain Examples 1-13.

(3) The Physical Characteristics of Examples 1-13 were Determined by the Method Described Below (i) Flexibility Test: the thermosetting compositions were coated on a metal foil (4×4.5 cm$^2$) and the metal foil was in an oven at 70° C. for 1 hour at first and then in a vacuum oven at 45° C. for 15 hour. Then, the metal foil was bent 3000 times. Next, observations by microscopy were made to the metal foil to check for cracks therein, wherein ⊕ represents that no cracks appeared in the metal foil, and x represents that some cracks appeared in the metal foil.

(ii) Peel Strength Test: the thermosetting compositions were coated on a metal foil (4×4.5 cm$^2$) and the metal foil was in an oven at 70° C. for 1 hour at first and then in a vacuum oven at 45° C. for 15 hours. Then, the metal foil was placed in an oven at 90° C. for 5-15 minutes to conduct a pre-reaction and then was adhered to a polyimide (PI) substrate at 60-90° C. for 30 minutes to conduct a curing reaction to obtain a sample. A peel force tester (QC Tech (Model: QC506B1)) was used to measure the peel strength of the sample. A higher value of the sample indicated a higher peel strength.

(iii) Water Vapor Transmission Rate (WVTR) Test: the thermosetting compositions were coated on a PET film and the PET film was in an oven at 70° C. for 1 hour at first and then in a vacuum oven at 45° C. for 15 hours. Then, the film was placed in a oven at 90° C. for 30 minutes to conduct a curing reaction to obtain a sample. The sample was measured by a water vapor transmission tester under a temperature of 40° C. and relative humidity of 90%. A higher value indicated better water vapor barrier ability.

(iv) Dark Spot Test: the thermosetting compositions were coated on a metal foil (4×4.5 cm$^2$) and the metal foil was in an oven at 70° C. for 1 hour at first and then in a vacuum oven at 45° C. for 15 hours. Then, the metal foil was placed in an oven at 90° C. for 5-15 minutes to conduct a pre-reaction. Then, the metal foil and an OLED device were laminated together under a temperature of 60-90° C. and then placed in an oven at 60-90° C. to complete a curing reaction.

The OLED device was observed under a temperature of 60° C. and relative humidity of 90% for 120 hours to see if any dark spot existed therein, wherein ⊕ represents that the growth ratio of dark spots was smaller than 5%, Ø represents that the growth ratio of dark spots was smaller than 10%, and x represents that the growth ratio of dark spots was larger than 10%.

TABLE 1 shows the compositions and physical characteristics of Example 1-13.

|  | Example 1 | Example 2 | Example 3 | Example 4 | Example 5 | Example 6 | Example 7 |
|---|---|---|---|---|---|---|---|
| EO-01 (%) | 30 | 20 | 9 | 3 | — | — | — |
| EO-02 (%) | — | — | — | — | 30 | 20 | 9 |
| EO-03 (%) | — | — | — | — | — | — | — |
| EO-04 (%) | — | — | — | — | — | — | — |

TABLE 1-continued

| | | | | | | | |
|---|---|---|---|---|---|---|---|
| PKHH (%) | 7 | 4 | 5 | — | 7 | 4 | 5 |
| EPIKOTE 1256 (%) | — | — | 4 | 5 | — | — | 4 |
| EPIKOTE 4250 (%) | — | 4 | — | 5 | — | 4 | — |
| ECN 1299 (%) | 17.5 | 20 | 23 | 24 | 17.5 | 20 | 23 |
| EPON 828 (%) | 35 | 40 | 45 | 48 | 35 | 40 | 45 |
| CN 997 (%) | 10.5 | 12 | — | 15 | — | 12 | 14 |
| CN 2200 (%) | — | — | 14 | — | 10.5 | — | — |
| DOUBLEMER 3710 (%) | — | — | — | — | — | — | — |
| BF3-MEA (phr)[1] | 1 | 1 | 0 | 0 | 1 | 1 | 0 |
| KBM 403 (phr) | — | — | — | — | — | — | — |
| talcum powder (phr) | 30 | 30 | 15 | 10 | 30 | 30 | 15 |
| Flexibility Test | ⊕ | ⊕ | ⊕ | ⊕ | ⊕ | ⊕ | ⊕ |
| Peel Strength Test (kgf) | 3.15 | 3.27 | 2.71 | 2.67 | 2.96 | 3.10 | 2.88 |
| Water Vapor Transmission Rate Test (g/m2·day) | 5.12 | 7.69 | 15.25 | 21.90 | 6.67 | 7.89 | 18.67 |
| Dark Spot Test | ∅ | ⊕ | ∅ | ∅ | ∅ | ⊕ | ∅ | shows the compositions and physical characteristics of Example 1-13.

| | Example 8 | Example 9 | Example 10 | Example 11 | Example 12 | Example 13 |
|---|---|---|---|---|---|---|
| EO-01 (%) | — | 10 | 10 | 30 | — | — |
| EO-02 (%) | 3 | 10 | 10 | — | — | — |
| EO-03 (%) | — | — | — | — | 30 | — |
| EO-04 (%) | — | — | — | — | — | 30 |
| PKHH (%) | — | 4 | 4 | 7 | 3 | 4 |
| EPIKOTE 1256 (%) | 5 | — | — | — | 3 | 3 |
| EPIKOTE 4250 (%) | 5 | 4 | 4 | — | 1 | — |
| ECN 1299 (%) | 24 | 20 | 20 | 17.5 | 17.5 | 17.5 |
| EPON 828 (%) | 48 | 40 | 40 | 35 | 35 | 35 |
| CN 997 (%) | — | — | — | 10.5 | — | — |
| CN 2200 (%) | 15 | — | 12 | — | 10.5 | — |
| DOUBLEMER 3710 (%) | — | 12 | — | — | — | 10.5 |
| BF3-MEA (phr)[1] | 0 | 1 | 1 | 1 | — | 1 |
| KBM 403 (phr) | — | — | — | 1 | — | 5 |
| talcum powder (phr) | 10 | 30 | 30 | 30 | 30 | 30 |
| Flexibility Test | ⊕ | ⊕ | ⊕ | ⊕ | ⊕ | ⊕ |
| Peel Strength Test (kgf) | 2.76 | 3.27 | 3.14 | 3.22 | 3.05 | 3.33 |
| Water Vapor Transmission Rate Test (g/m2·day) | 23.56 | 5.22 | 7.41 | 5.6 | 6.5 | 8.9 |
| Dark Spot Test | ∅ | ⊕ | ⊕ | ∅ | ∅ | ∅ |

[1]: the term "phr" used in Table 1 is abbreviation for "parts per hundreds of resin".

As shown in Table 1, the thermosetting composition of the disclosure has an ability to inhibit the formation of dark spots, exhibits good gas barrier properties, and has good flexibility and good adhesion to the substrate. Therefore, the thermosetting composition of the disclosure may potentially be used as a sealing material for organic electroluminescent devices.

Table 2 shows the compositions and physical characteristics of Comparative Examples 1-4.

TABLE 2

| | Comparative Example 1 | Comparative Example 2 | Comparative Example 3 | Comparative Example 4 |
|---|---|---|---|---|
| EO-01 (%) | 100 | — | 30 | 10 |
| EO-02 (%) | — | — | — | 10 |
| EO-03 (%) | — | — | — | — |
| EO-04 (%) | — | — | — | — |
| PKHH (%) | — | — | 7 | 4 |
| EPIKOTE 1256 (%) | — | — | — | 4 |
| EPIKOTE 4250 (%) | — | 10 | — | 4 |
| ECN 1299 (%) | — | 25 | 17.5 | 20 |
| EPON 828 (%) | — | 50 | 35 | 40 |
| CN 997 (%) | — | 15 | — | — |
| CN 2200 (%) | — | — | — | — |
| DOUBLEMER 3710 (%) | — | — | — | — |
| BF3-MEA (phr)[1] | — | 1 | 1 | 1 |
| KBM 403 (phr) | — | — | — | 1 |
| talcum powder (phr) | — | 30 | 30 | 30 |
| Flexibility Test | x | ⊕ | ⊕ | ⊕ |
| Peel Strength Test (kgf) | 0 | 1.69 | 0.62 | 0.37 |
| Water Vapor Transmission Rate Test (g/m2·day) | 8.97 | 13.55 | 5.01 | 6.99 |
| Dark Spot Test | x | ∅ | x | x |

As shown in Table 2, when the thermosetting composition of Comparative Example 1 had only EO-01, it had bad adhesion to the substrate. When the thermosetting composition of Comparative Example 2 had no oligomers, it had adhesion strength to the substrate of less than 2 kg. When the thermosetting composition of Comparative Examples 3-4 had no plasticizer, they had adhesion strength to the substrate of less than 1 kg. Additionally, the thermosetting compositions of Comparative Examples 1-4 had no ability to inhibit the formation of dark spots.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermosetting composition, comprising components (a)-(d):
   (a) about 1-35 wt % of an oligomer, wherein the oligomer is obtained by reacting a liquid epoxy resin with an aromatic primary amine having four active hydrogen atoms, and the liquid epoxy resin and the primary amine have an equivalent mole ratio of 1:0.15-1:2.50;
   (b) about 5-10 wt % of a long chain resin;
   (c) about 50-80 wt % of an epoxy resin having at least two functional groups; and
   (d) about 5-15 wt % of a plasticizer, wherein the plasticizer comprises urethane acrylate oligomer, polyester acrylate oligomer, phthalate esters or their derivatives and wherein the long chain resin of the component (b) has an average molecular weight of larger than 50,000 and comprises phenoxy epoxy resin, bisphenol A epoxy resin, bisphenol F epoxy resin, bisphenol A/F epoxy resin or their derivatives.

2. The thermosetting composition as claimed in claim 1, wherein the liquid epoxy resin of the component (a) comprises bisphenol A epoxy resin, bisphenol F epoxy resin, aliphatic epoxy resin, cycloaliphatic epoxy resin or their derivatives.

3. The thermosetting composition as claimed in claim 1, wherein the aromatic primary amine having four active hydrogen atoms of the component (a) comprises 4,4'-diaminodiphenyl sulfone, 4-aminobenzenesulfonamide 4,4'-diaminodiphenyl ether, 4,4'-(1,3-Phenylenedioxy)dianiline, 4,4'-diaminodiphenyl methane or their derivatives.

4. The thermosetting composition as claimed in claim 1, wherein the epoxy resin of the component (c) comprises cresol novolac epoxy resin, phenol novolac epoxy resin, bisphenol A epoxy resin, bisphenol F epoxy resin, aliphatic epoxy resin, cycloaliphatic epoxy resin or their derivatives.

5. The thermosetting composition as claimed in claim 1, further comprising a thermo-curing agent.

6. The thermosetting composition as claimed in claim 5, wherein the thermo-curing agent comprises boron trifluoride monoethylamine, boron trifluoride p-toluidine, boron trifluoride N,N-dimethyl-p-toluidine, boron trifluoride benzyl amine or boron trifluoride N,N-dimethyl amine.

7. The thermosetting composition as claimed in claim 1, further comprising a filler.

8. The thermosetting composition as claimed in claim 7, wherein the filler comprises silicon dioxide, talcum powder, aluminum oxide or clay.

9. The thermosetting composition as claimed in claim 1, further comprising a coupling agent.

10. The thermosetting composition as claimed in claim 9, wherein the coupling agent comprises 3-glycidoxypropyltrimethoxysilane, 2-(3,4 epoxycyclohexyl)-ethyltrimethoxysilane, 3-glycidoxypropylmethyl diethoxy silane, or 3-glycidoxypropyltriethoxysilane.

* * * * *